(12) United States Patent
Hilt et al.

(10) Patent No.: US 11,716,907 B2
(45) Date of Patent: Aug. 1, 2023

(54) ELECTROMECHANICAL MICROSYSTEM COMPRISING AN ACTIVE ELEMENT HAVING A STRUCTURED CORE LAYER

(71) Applicant: COMMISSARIAT A L'ENERGIE ATOMIQUE ET AUX ENERGIES ALTERNATIVES, Paris (FR)

(72) Inventors: Thierry Hilt, Grenoble (FR); Stephane Fanget, Grenoble (FR); Loic Joet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 675 days.

(21) Appl. No.: 16/717,866

(22) Filed: Dec. 17, 2019

(65) Prior Publication Data
US 2020/0203594 A1    Jun. 25, 2020

(30) Foreign Application Priority Data
Dec. 18, 2018   (FR) ...................................... 18 73251

(51) Int. Cl.
*H10N 30/87*   (2023.01)
*B81B 7/00*   (2006.01)

(52) U.S. Cl.
CPC ........... *H10N 30/87* (2023.02); *B81B 7/0006* (2013.01)

(58) Field of Classification Search
CPC . H01L 41/047; H01L 41/313; H01L 41/0973; H01L 41/0933; B81B 7/0006; H10N 30/87
See application file for complete search history.

(56) References Cited

U.S. PATENT DOCUMENTS

| 2017/0246662 A1 | 8/2017 | Kidwell, Jr. et al. |
| 2018/0078970 A1 | 3/2018 | Ono et al. |

FOREIGN PATENT DOCUMENTS

| CN | 106716636 | * | 5/2017 | ......... H01L 21/6836 |
| EP | 0 035 187 A1 | | 9/1981 | |
| JP | 6-275884 A | | 9/1994 | |

OTHER PUBLICATIONS

U.S. Appl. No. 15/625,314, filed Jun. 16, 2017, 2017/0363424 A1 U.S. Pat. No. 11,156,459, Maspero et al.
(Continued)

*Primary Examiner* — Jasmine J Clark
(74) *Attorney, Agent, or Firm* — Oblon, McClelland, Maier & Neustadt, L.L.P.

(57) ABSTRACT

A MicroElectroMechanical System is provided, with an active element configured to carry out an electromechanical function, the active element including, from an upper face to a lower face substantially parallel to the upper face, an active layer, a core layer, and a retention layer, the active layer being configured to, under the effect of a first electric signal, go into a mechanically stressed state, configured to generate a bending of the active element in a direction perpendicular to a front face thereof, and vice versa, the active layer, the core layer, and the retention layer being arranged so that a neutral axis, associated with an elongation of zero in a case of bending of the active element, is located in a volume of one or the other of the core layer and of the retention layer, and the core layer further includes at least 20% recesses in its volume.

14 Claims, 4 Drawing Sheets

(56) References Cited

OTHER PUBLICATIONS

U.S. Appl. No. 16/244,257, filed Jan. 10, 2019, 2019/0219887 A1
U.S. Pat. No. 10,670,942, Casset et al.
U.S. Appl. No. 16/348,004, filed May 7, 2019, 2021/0114865, Joet et al.
U.S. Appl. No. 16/466,432, filed Jun. 4, 2019, 2019/0308873 A1
U.S. Pat. No. 10,807,858, Joet.
U.S. Appl. No. 16/475,901, filed Jul. 3, 2019, 2019/0344278 A1, Agache et al.
U.S. Appl. No. 16/514,090, filed Jul. 17, 2019, U.S. Pat. No. 11,035,734, Le Rhun et al.
U.S. Appl. No. 16/591,970, filed Oct. 3, 2019, U.S. Pat. No. 11,262,246, Le Rhun et al.
U.S. Appl. No. 16/590,015, filed Oct. 1, 2019, U.S. Pat. No. 10,968,096, Joet et al.
U.S. Appl. No. 16/717,866, filed Dec. 17, 2019, 2020/0203594, Hilt et al.
French Preliminary Search Report dated Nov. 28, 2019 in French Application 18 73251 filed on Dec. 18, 2018 (with English Translation of Categories of Cited Documents), 2 pages.
Jean-Louis Fanchon, "Guide De Mécanique", 2001, 481 pages.

\* cited by examiner

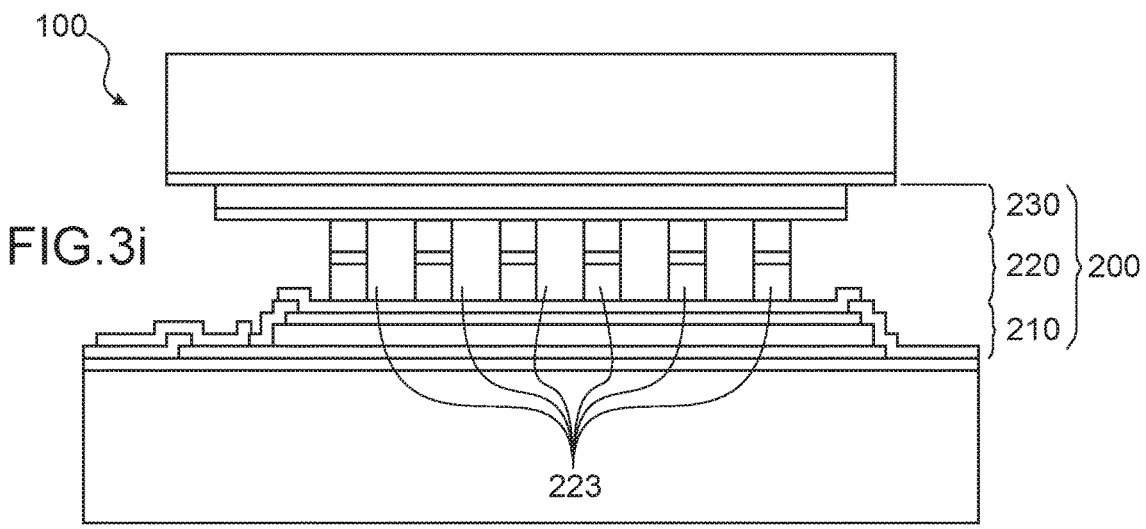
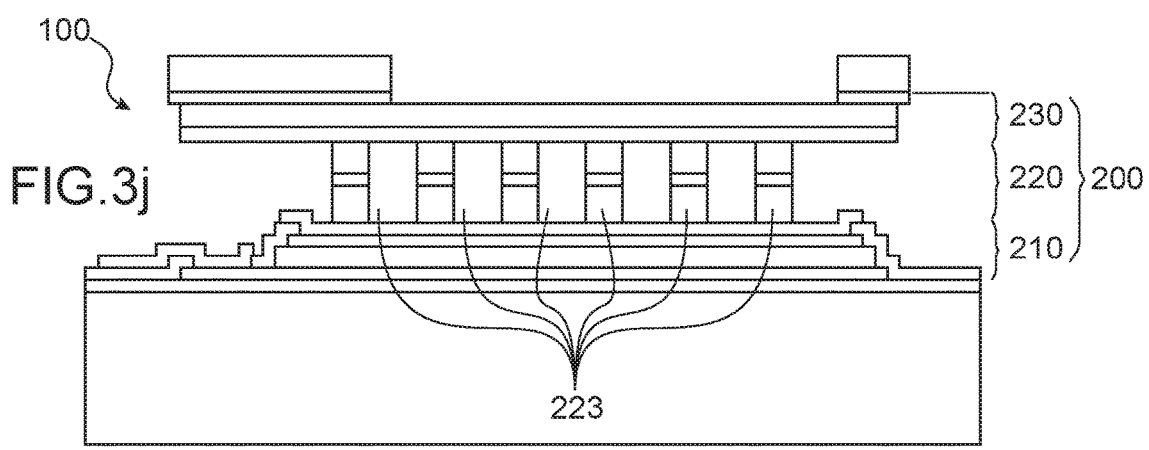
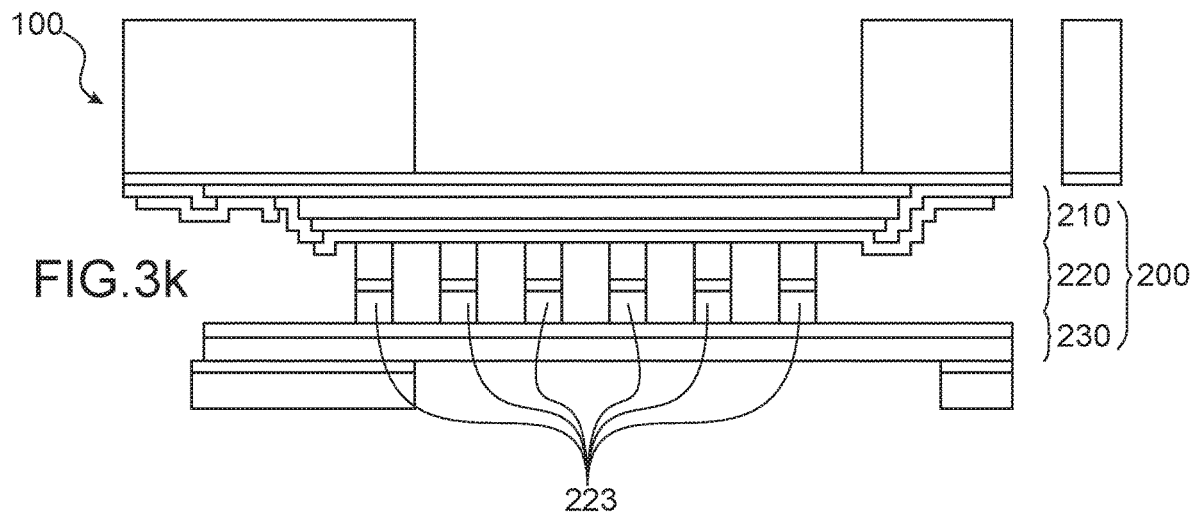

ELECTROMECHANICAL MICROSYSTEM COMPRISING AN ACTIVE ELEMENT HAVING A STRUCTURED CORE LAYER

TECHNICAL FIELD

The invention belongs to the field of electromechanical systems, and namely MicroElectroMechanical Systems ("MEMS").

In particular, the invention relates to an electromechanical system provided with an active element forming a beam or a membrane capable of bending under the effect of an electric signal and vice versa.

The active element, according to the present invention, can namely by implemented to carry out a sensor function or an actuation function.

PRIOR ART

The known MicroElectroMechanical Systems of the prior art, whether they are intended to carry out a sensor or actuator function, carry out said function via an active element adapted to transforming an electric signal into a physical signal and vice versa.

The physical signal can namely comprise a temperature (thermal signal), a magnetic field (magnetic signal), a force or pressure, a remote stress (gravity, acceleration) or a vibration.

The active element generally comprises a multilayer assembly forming for example a membrane or a beam.

In this respect, FIG. 1 illustrates the structure of an active element 1 of a known MEMS of the prior art which comprises, from a front face towards a rear face substantially parallel to the front face an active layer 2 resting on a retention layer 3.

The active layer comprises in particular a material that is capable of undergoing a deformation and deforming the beam or membrane in a direction perpendicular to the plane defined by the front face as soon as an electric signal is imposed thereon or vice versa.

In particular, the active element of a MEMS operating in sensor mode will undergo a deformation under the action of an outside stress so that said active element produces an electric signal representative of said outside stress.

On the contrary, the active element of a MEMS operating in actuator mode will undergo a deformation under the action of an electric signal, in such a way as to impose a mechanical action on the outside environment, for example to pivot a micromirror.

The previously mentioned bending phenomenon of the beam or membrane satisfies the principles stated in beam theory and namely in the document [1] cited at the end of the description.

This theory reveals the existence of a surface called neutral axis, in the volume of the active element, parallel to the upper face of the active element and which undergoes neither elongation nor shrinking during the bending of said active element.

The neutral axis defines with the upper face and with the lower face, respectively, a first region and a second region, each subjected to an opposite stress when the active element is bent.

In order to confer on the active element a rigidity that is sufficient and compatible with the actuator or sensor functions intended, the retention layer in general has a thickness and/or a rigidity greater than the active layer so that the neutral axis is located in said retention layer.

This configuration is not, however, satisfactory.

Indeed, as soon as the system operates in actuator mode, the contraction of the active layer, via the applying of an electric signal, also contributes to contracting the part of the retention layer located in the first region.

This loss of energy translates into a loss of energy exerted by the active layer and consequently a loss of efficiency of the MicroElectroMechanical System.

Likewise in the context of a sensor use, such an effect translates into a loss of sensitivity of said sensor.

The solution involving reducing the rigidity imposed by the retention layer, for example by reducing the thickness of said layer, would have the consequence of reducing the force exerted by the active element when the latter is subjected to the electric signal.

Moreover, for certain uses, namely micropumps, or speakers, the trend is to thicken the active element.

Thus, one goal of the present invention is to propose a MicroElectroMechanical System that has better energy efficiency or better sensitivity than the known MicroElectroMechanical Systems of the prior art.

Another goal of the present invention is to propose a MicroElectroMechanical System provided with an active element thicker than the known active elements of the prior art without degrading the energy efficiency or the sensitivity of the MicroElectroMechanical System in question.

DESCRIPTION OF THE INVENTION

The goals of the present invention are, at least partly, met by a MicroElectroMechanical System provided with an active element capable of carrying out an electromechanical function, the active element comprises, from an upper face to a lower face substantially parallel to the upper face, an active layer a core layer and a retention layer, the active layer being adapted to, under the effect of a first electric signal, go into a mechanically stressed state, intended to generate a bending of the active element in a direction perpendicular to the front face, and vice versa, the active layer, the core layer and the retention layer are arranged so that a neutral axis, associated with an elongation of zero in the case of bending of the active element, is located in the volume of one or the other of the core layer and of the retention layer, the core layer further comprises at least 20%, advantageously at least 30%, even more advantageously at least 50%, recesses in its volume, According to one mode of implementation, the recesses are comprised in a section of volume defined by the neutral axis and an interface formed between the active layer and the core layer.

According to one mode of implementation, the recesses are comprised in a section of volume defined by the neutral axis and an interface formed by the core layer and the retention layer.

According to one mode of implementation, the recesses are regularly distributed in all the volume of the core layer.

According to one mode of implementation, the recesses form through-holes opening onto each of the interfaces that said core layer forms with, respectively, the active layer and the retention layer.

According to one mode of implementation, the core layer comprises pillars, spaced apart from each other, that advantageously extend, according to their largest dimension called height H, between the two interfaces that said core layer forms with the active layer and the retention layer.

According to one mode of implementation, the retention layer and the core layer are made from the same material According to one mode of implementation, the pillars comprise a metal, advantageously the metal comprises at least one of the species chosen from: copper, nickel.

According to one mode of implementation, the active layer comprises a piezoelectric-material layer.

According to one mode of implementation the active layer further comprises two electrodes in the form of layers between which the layer of piezoelectric material is interposed, and which are intended to apply the first electric signal to the layer of piezoelectric material.

According to one mode of implementation, the retention layer is adapted to, when it is subjected to a second electric signal, go into a mechanically stressed state opposite to the stressed state of the active layer when the latter is subjected to the first electric signal.

According to one mode of implementation, the active element is a beam.

According to one mode of implementation, the active element comprises a membrane.

The invention also relates to a MicroElectroMechanical System provided with an active element capable of carrying out a microelectromechanical function, the active element comprises, from an upper face to a lower face substantially parallel to the upper face, an active layer, a core layer and a retention layer, the active layer being adapted to, under the effect of an electric signal, go into a mechanically stressed state, advantageously a state of compression, intended to generate a bending of the active element in a direction perpendicular to the front face, and vice versa, the active layer, the core layer and the retention layer are arranged so that the neutral axis associated with an elongation of zero in the case of bending of the active element, is located in the volume of one or the other of the core layer and of the retention layer the core layer, comprises a mechanically anisotropic, advantageously orthotropic, material, arranged so that its direction having the greatest rigidity is normal to the front face.

According to one mode of implementation, the active layer comprises a layer of piezoelectric material.

According to one mode of implementation the active layer further comprises two electrodes in the form of layers between which the layer of piezoelectric material is interposed, and which are intended to apply the first electric signal onto the layer of piezoelectric material.

According to one mode of implementation, the retention layer is adapted to, when it is subjected to a second electric signal, go into a mechanically stressed state opposite to the stressed state of the active layer when the latter is subjected to the first electric signal.

According to one mode of implementation, the active element is a beam.

According to one mode of implementation, the active element comprises a membrane.

BRIEF DESCRIPTION OF THE DRAWINGS

Other features and advantages will appear in the following description of a MicroElectroMechanical System according to the invention, given as non-limiting examples, in reference to the appended drawings in which:

FIGS. 3a to 3k are schematic representations of a method for manufacturing a MicroElectroMechanical System according to the present invention.

DETAILED DESCRIPTION OF SPECIFIC EMBODIMENTS

Figure 1:
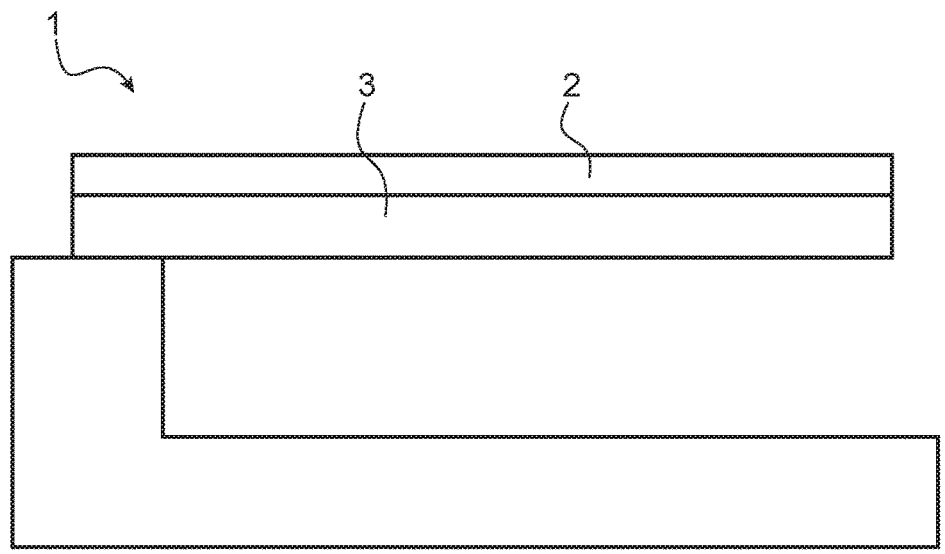
FIG. 1 is a representation of an active element at rest of a known MEMS of the prior art, the active element is namely shown in a cross-section according to a plane perpendicular to the front face of said element.
Figure 2:
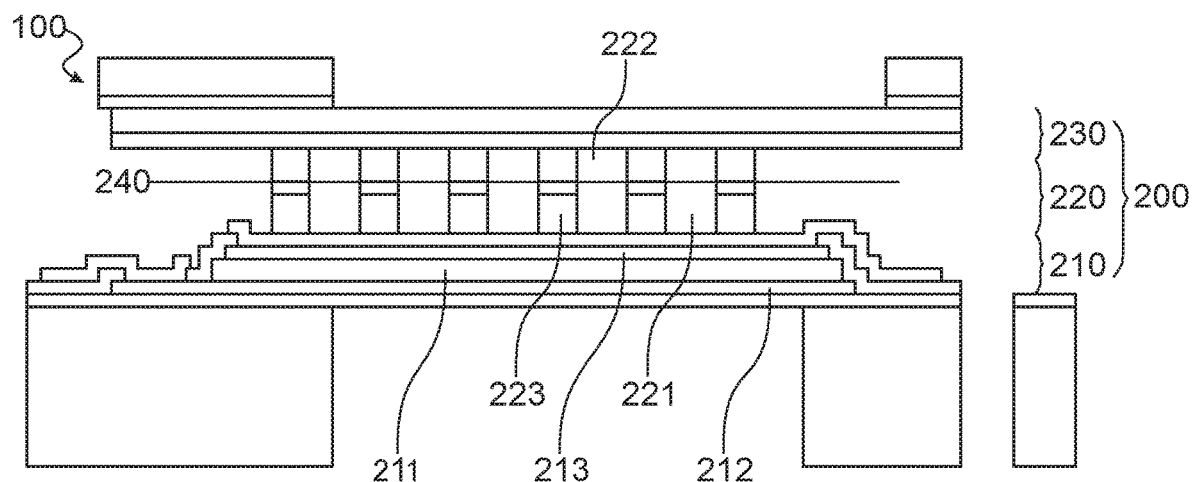
FIG. 2 is a schematic representation of the active element according to an embodiment of the present invention, the representation is namely established according to a cross-sectional plane perpendicular to the main faces of the active element.

The present invention described in detail in the rest of the disclosure relates to a MicroElectroMechanical System provided with an active element made of a stack that comprises, from an upper face to a lower face, an active layer, a core layer and a retention layer intended to ensure a mechanical retention of said active element.

The core layer, according to the terms of the present invention, is structured in such a way as to confer an anisotropic rigidity onto said layer.

In particular, the core layer has a rigidity in a direction perpendicular to the front lace greater than its rigidity in a direction parallel to this same face.

Moreover, the layers forming the active element are dimensioned in terms of thickness and/or mechanical properties in such a way that the neutral axis is located either in the volume of the core layer or in that of the retention layer.

According to a specific embodiment of the invention, the neutral axis can be in the volume of the core layer, for example near the interface formed between the core layer and the retention layer.

A positioning of the neutral axis at half-distance between the active layer and the retention layer can also be considered namely if the retention layer is also active.

The location of the neutral axis according to the terms of the invention allows namely to minimize the stress necessary for the bending of the active element.

FIGS. 2, and 3a to 3k show a MicroElectroMechanical System 100 according to the terms of the present invention.

The MicroElectroMechanical System can ensure via an active element 200, either a sensor function, like a microphone, or an actuator function, for the movement of micromirrors for example.

The active element 200 comprises two main faces called, respectively, upper face and lower face substantially parallel to each other.

The active element 200 can take the form of a beam or of a membrane.

It is understood without it being necessary to specify it that the active element 200, regardless of its form, is generally maintained according to one or more of its edges to a support.

The active element 200 comprises, from its upper face to its lower face, an active layer 210, a core layer 220, and a retention layer 230.

The active layer 210 is in particular adapted to having its stress state vary as soon as an electric signal, called first electric signal, is imposed on it and vice versa.

The change in stress state can comprise a compression or a tension of the active layer 210.

The first electric signal can comprise a voltage imposed on the active layer, imposed namely on each of the faces of the active layer 210.

In this respect, the active layer 210 can comprise a layer of piezoelectric material 211 as well as two electrodes 212, 213 overlapping with each of the faces of said layer of piezoelectric material 211.

The two electrodes 212 and 213 are namely intended to impose an electric voltage between each of the main faces of the layer of piezoelectric material.

The layer of piezoelectric material 211 can comprise at least one of the piezoelectric materials chosen from: PZT, AlN, LNO.

The layer of piezoelectric material can have a thickness between 10 nm and 5 mm.

An active element 210 in the form of a beam can have a length between 100 nm and 20 mm, and a width between 100 nm and 20 mm.

The width and the length of an active element 210 forming a beam are, according to the present invention, the dimensions of its upper face and of its lower face.

An active element 210 in the form of a membrane can have a round, square, rectangular or trapezoidal shape.

The active element 210 can also take the shape of a spiral. According to this configuration it is possible to consider a strip having a large length wound onto itself, and thus occupying a reduced space.

The electrodes can have a thickness between 1 nm and 100 μm, and comprise at least one of the elements chosen from: Cu, Mo, Pt, Ru, Al, Ni, Au.

The retention layer 230 ensures the mechanical strength of the assembly formed by the active layer 210, the core layer 220, and said retention layer 230.

The retention layer 230 can comprise at least one of the materials chosen from: Silicon, Cu, Ni, Al.

The retention layer 230 can have a thickness between 1 μm and 1 mm.

In a particularly advantageous manner, the retention layer 230 can be adapted to, when it is subjected to a second electric signal, go into a mechanically stressed state opposite to the stressed state of the active layer 210 when the latter is subjected to the first electric signal.

The core layer 220 is arranged, with the retention layer 230, so that a neutral axis 240 associated with an elongation of zero in the case of bending of the active element 200, is located in the volume of the core layer or of the retention layer.

A person skilled in the art, with the general knowledge thereof, is capable of dimensioning the core layer 220 in terms of thickness and mechanical properties with a view to positioning the neutral axis in one or the other of the core layer or of the retention layer.

According to a first embodiment, the core layer 220 can comprise at least 20%, advantageously at least 30%, even more advantageously at least 50%, recesses 221.

The recesses 221 can be comprised in a section of volume defined by the neutral axis 240 and an interface formed between the active layer 210 and the core layer 220.

Alternatively, the recesses 221 can be comprised in a section of volume defined by the neutral axis 240 and an interface formed between the core layer 220 and the retention layer 230.

"Recess" means for example cavities, in other words zones of the core layer 220 devoid of material.

The recesses 221 present in the recess section 222 allow the reduction of the stress necessary for the bending of the core layer 220 in the recess section 222.

The recesses 221 can be regularly distributed in the recess section 222, and more particularly throughout the volume of the core layer 220.

In particular, the recesses 221 form through-holes opening onto each of the interfaces that said core layer 220 forms with, respectively, the active layer 210 and the retention layer 230.

Namely, the through-holes can correspond to spaces arranged between pillars 223 that form the core layer 220.

In other words, the core layer 220 can comprise pillars, spaced apart from each other, that extend, according to their largest dimension, called height H, between the two interfaces that said core layer 220 forms with the active layer 210 and the retention layer 230.

The height H of the pillars 223 can be between 5 μm and 1 mm.

The pillars 223 can also have an aspect ratio, defined by the ratio between their height H and their width or diameter, between 0.1 and 30.

The pillars 223 can moreover be metallic.

In particular, the pillars 223 can comprise at least one of the elements chosen from: copper, nickel, aluminum.

According to a second embodiment, the core layer 220 can comprise a mechanically anisotropic, advantageously orthotropic, material arranged so that its direction having the greatest rigidity it normal to the front face.

"Mechanically anisotropic" means a material that has an anisotropic rigidity.

In particular, the rigidity in the direction normal to the front face is called normal rigidity as opposed to the rigidity in a plane defined by the front face, called parallel rigidity.

"Orthotropic material" means a material that has an anisotropic rigidity according to three orthogonal main axes.

In particular, the normal rigidity can be ten times greater than the parallel rigidity.

A material can naturally have orthotropic properties, and comprise at least one crystalline material.

An orthotropic material can also be the result of a mixture of materials. For example, the core layer 220 can comprise a bulk material in which fibers oriented or particles oriented in a direction normal to the front face are embedded.

FIGS. 3a to 3k illustrate the various steps of a method for manufacturing a MicroElectroMechanical System that comprises a core layer made form pillars according to the first mode of implementation. However, a person skilled in the art with the general knowledge thereof can adapt this manufacturing method in the context of the second embodiment.

Figure 3A:
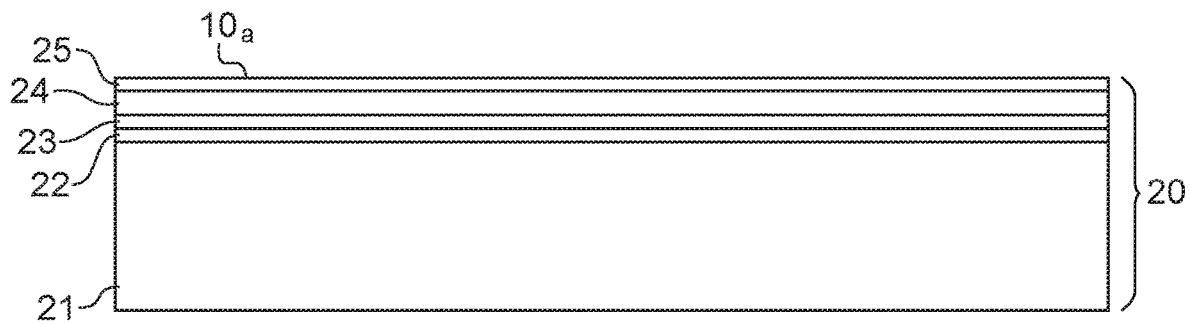

The manufacturing method thus comprises the following steps.

a) A step a) which comprises the formation of a stack of layers 20, intended to form the active layer 210, on a first face 10a of a first substrate namely a silicon substrate (FIG. 3a).

Figure 3B:
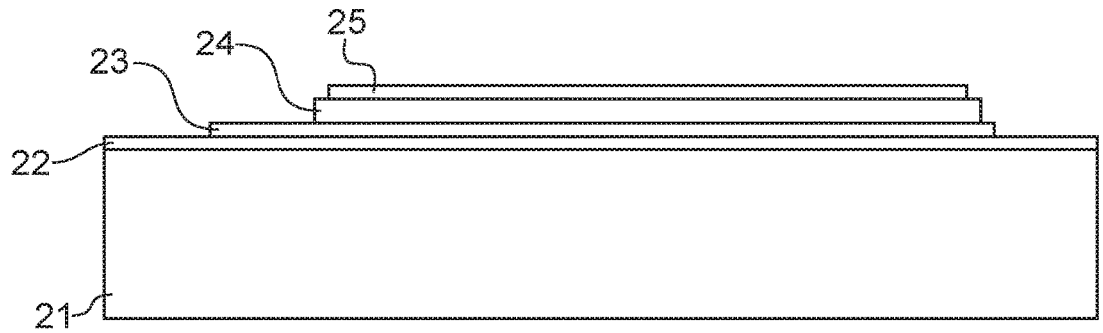
Figure 3C:
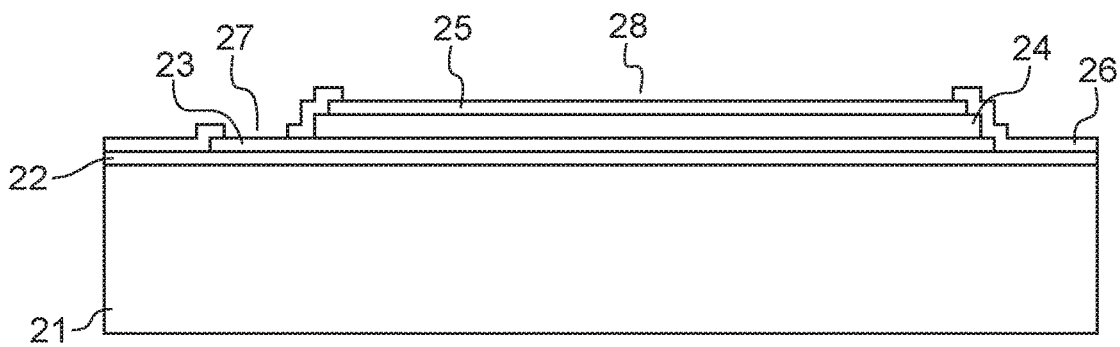

The stack of layers 20 comprises namely, starting from the first face 10a:
a layer of thermal oxide 21;
a layer of titanium oxide 22;
a layer of platinum 23 intended to form, with the layer of titanium oxide, an electrode;
a layer of piezoelectric material 24 which comprises lead titanate zirconate;
a layer of ruthenium 25, intended to form an electrode.

b) The step a) is then followed by a step b) which comprises a step of etching the stack of the layers intended to define the extension of the active layer (FIG. 3b).

c) A step c) of defining contacts at the electrodes formed by the layer of platinum 23 and the layer of ruthenium 25 (FIG. 3c).

This step c) comprises namely the formation of a passivation layer 26, for example silicon oxide, and the formation of openings 27, 28 in said layer, by etching, in order to access the electrodes.

d) A step d) of forming contacts at the openings 27, 28 formed in the passivation layer 26.

Figure 3D:
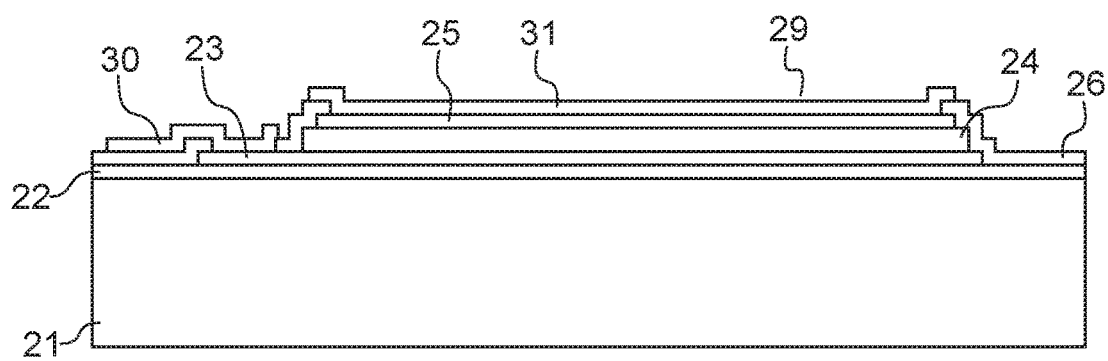
Figure 3E:
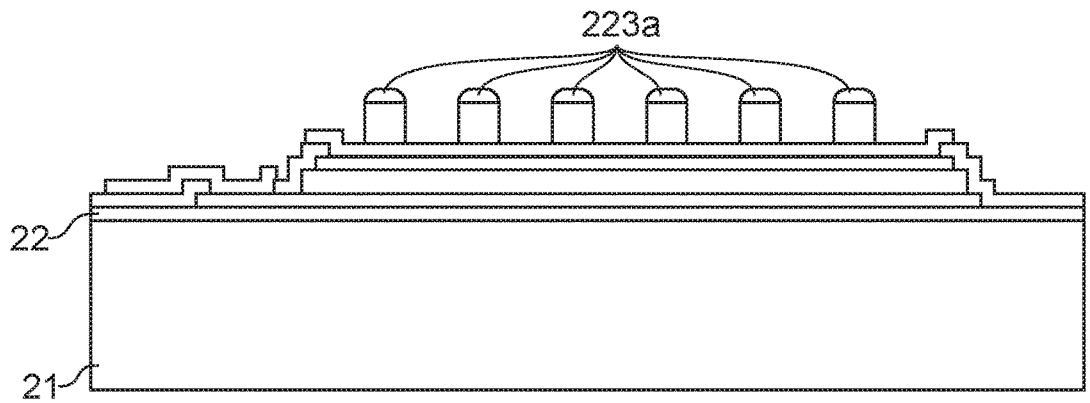

The step d) comprises in this respect the formation of a layer of gold and of titanium 29, followed by an etching of said layer intended to define the contacts 30, 31 (FIG. 3d).

e) A step e) of forming first half-pillars 223a intended to form, with second half-pillars 223b, the pillars of the core layer 220 (FIG. 3e).

Figure 3F:
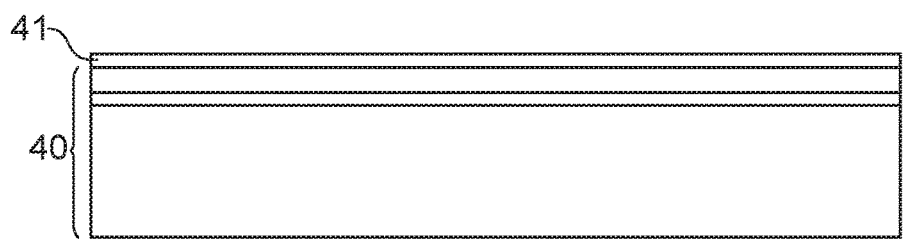
Figure 3G:
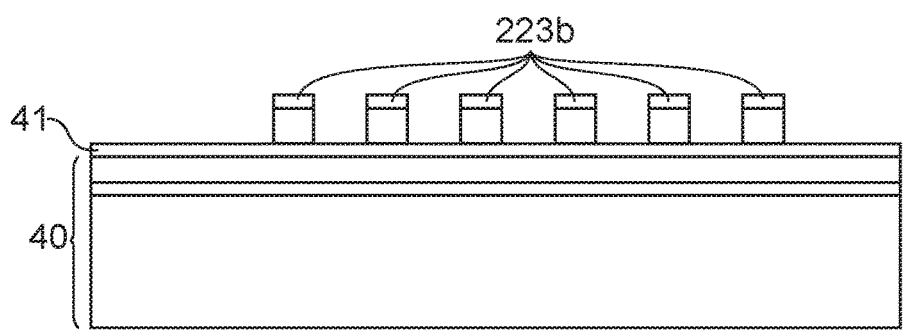

The step e) of forming the first half-pillars 223a comprises in particular a step of electrodeposition.

f) A step f) which involves providing a second substrate 40, namely a silicon-on-insulator substrate. The second substrate also comprises, on its silicon layer, a layer of silicon oxide 41 (FIG. 3f).

g) a step g) of forming the second half-pillars 223b, on the layer of silicon oxide 41 (FIG. 3g). The second half-pillars 223b are arranged in such a way as to correspond to the first half-pillars 223a.

Figure 3H:
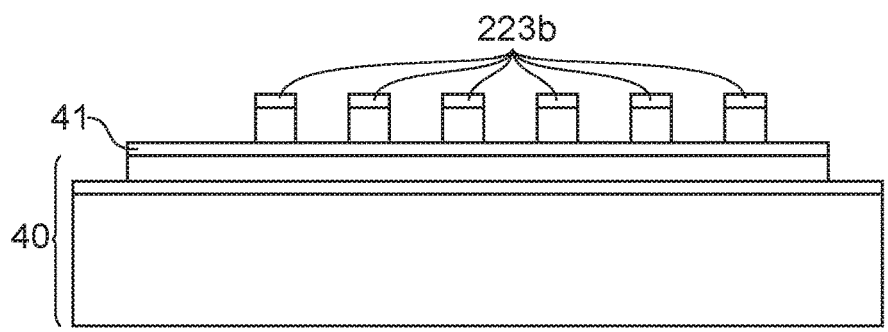

The step g) comprises a step of electrodeposition.

h) a step h) of etching in such a way as to define the retention layer 230 in the stack formed by the layer of silicon of the second substrate 40, and by the layer of silicon oxide 41 (FIG. 3h).

i) a step i) of assembly of the first substrate and of the second substrate which comprises placement of the first half-pillars in contact with the second half-pillars in such a way as to form the pillars 223 of the core layer 220 (FIG. 3i).

Finally, the method comprises steps of etching of the first substrate (FIG. 3j) and of the second substrate (FIG. 3k) intended to partly free the active element.

According to one or of the two embodiments presented in the present invention, the active element 200 confers better energy efficiency on the MicroElectroMechanical System.

Indeed, regardless of the embodiment presented, the first region defined by the neutral axis and the active layer has a controlled rigidity in a direction parallel to the front face. It is thus possible to bend the active element without dissipating too much energy at this first region.

A greater normal rigidity moreover allows the active element to produce a significant force.

The implementation of the core layer also makes possible active elements thicker than those known from the prior art.

REFERENCES

[1]: Jean-Louis Fanchon, *Guide de mécanique*, Nathan, 2001 (ISBN 2-09-178965-8),

The invention claimed is:

1. A MicroElectroMechanical System provided with an active element configured to carry out an electromechanical function,
the active element comprising, from an upper face to a lower face substantially parallel to the upper face, an active layer, a core layer, and a retention layer, the active layer being configured to, under the effect of a first electric signal, go into a mechanically stressed state, configured to generate a bending of the active element in a direction perpendicular to a front face thereof, and vice versa,
the active layer, the core layer, and the retention layer being arranged so that a neutral axis, in a case of bending of the active element but no elongation of the active element, extends through a volume of one or the other of the core layer and of the retention layer, and
the core layer further comprises at least 20% recesses in the volume of the core layer.

2. The MicroElectroMechanical System according to claim 1, wherein the recesses are comprised in a section of the volume of the core layer defined between the neutral axis and an interface formed between the active layer and the core layer.

3. The MicroElectroMechanical System according to claim 1, wherein the recesses are comprised in a section of the volume of the core layer defined between the neutral axis and an interface formed between the core layer and the retention layer.

4. The MicroElectroMechanical System according to claim 1, wherein the recesses are regularly distributed in all of the volume of the core layer.

5. The MicroElectroMechanical System according to claim 1, wherein the recesses form through-holes opening onto each of the interfaces that the core layer forms with, respectively, the active layer and the retention layer.

6. The MicroElectroMechanical System according to claim 1, wherein the core layer comprises pillars, spaced apart from each other, that extend, according to their largest dimension, called height H, between the two interfaces that the core layer forms with the active layer and the retention layer.

7. The MicroElectroMechanical System according to claim 6, wherein the pillars comprise a metal.

8. The MicroElectroMechanical System according to claim 1, wherein the retention layer and the core layer are made from a same material.

9. The MicroElectroMechanical System according to claim 1, wherein the active layer comprises a layer of piezoelectric material.

10. The MicroElectroMechanical System according to claim 9, wherein the active layer further comprises two electrodes in the form of layers between which the layer of piezoelectric material is interposed, and which are configured to apply the first electric signal onto the layer of piezoelectric material.

11. The MicroElectroMechanical System according to claim 1, wherein:
the active layer is configured to, under the effect of the first electric signal, go into one of a compression state and a tension state, and
the retention layer, when subjected to a second electric signal is configured to go into a mechanically stressed state opposite to the compression or tension state of the active layer when the latter is subjected to the first electric signal.

12. The MicroElectroMechanical System according to claim 1, wherein the active element is a beam.

13. The MicroElectroMechanical System according to claim 1, wherein the active element comprises a membrane.

14. A MicroElectroMechanical System provided with an active element configured to carry out a microelectromechanical function,
the active element comprising, from an upper face to a lower face substantially parallel to the upper face, an active layer, a core layer, and a retention layer, the active layer being configured to, under the effect of an electric signal, go into a mechanically stressed state configured to generate a bending of the active element in a direction perpendicular to a front face thereof, and vice versa, the active layer, the core layer, and the retention layer being arranged so that a neutral axis, in a case of bending of the active element but no elongation of the active element, extends through a volume of one or the other of the core layer and of the retention layer, and the core layer further comprises a mechanically anisotropic material, arranged so that a direction thereof having greatest rigidity is normal to the front face.

* * * * *